United States Patent [19]

Kimata et al.

[11] Patent Number: 4,809,048
[45] Date of Patent: Feb. 28, 1989

[54] CHARGE-COUPLED DEVICE HAVING CHANNEL REGION WITH ALTERNATELY CHANGING POTENTIAL IN A DIRECTION PERPENDICULAR TO CHARGE TRANSFER

[75] Inventors: Masafumi Kimata; Natsuro Tsubouchi, both of Itami, Japan

[73] Assignee: Mitsubishi Denki Kabushiki Kaisha, Tokyo, Japan

[21] Appl. No.: 13,189

[22] Filed: Feb. 9, 1987

Related U.S. Application Data

[63] Continuation of Ser. No. 804,072, Dec. 3, 1985, abandoned.

[30] Foreign Application Priority Data

Dec. 21, 1984 [JP] Japan .................... 59-271546

[51] Int. Cl.⁴ .................... H01L 29/78; G11C 19/28
[52] U.S. Cl. .................... 357/24; 377/58
[58] Field of Search .................... 357/24; 377/57-63

[56] References Cited

U.S. PATENT DOCUMENTS 3,986,197 10/1976 Ablassmeier .................... 357/24 M
4,362,575 12/1982 Wallace .................... 357/24 M
4,667,213 5/1987 Kosonocky .................... 357/24 M

OTHER PUBLICATIONS

"The Buried Channel Charge Coupled Device", R. H. Walden et al., Bell System Technical Journal, vol. 51, 1972, pp. 1635–1640.

"Low-Temperature Characteristics of Buried-Channel Charge-Coupled Devices", Masafumi Kimata et al., Japanese Journal of Applied Physics, vol. 22, No. 6, Jun. 1983, pp. 975–980.

Primary Examiner—Gene M. Munson
Attorney, Agent, or Firm—Lowe, Price, Leblanc, Becker & Shur

[57] ABSTRACT

A charge-coupled device comprises a p type silicon substrate (130), a plurality of n type impurity regions (121) of a high impurity concentration, a plurality of n type impurity regions (140) of a low impurity concentration, a silicon oxide film (150) for defining a channel region (10), a gate oxide film (110), a plurality of gate electrodes (21, 31, 41, 51, 22, 32, 42 and 52) and clock bus lines (70, 80, 90 and 100) for applying a clock signal to the respective gate electrodes. The n type impurity regions (121) and (140) are formed alternately in the channel region (10) along a direction perpendicular to the charge transfer direction, whereby the potential in the channel region (10) changes in the above described perpendicular direction. The change of the potential causes a strong electric field in the channel region (10) in the above described perpendicular direction, which serves to prevent carriers from freezing to an impurity level at a low temperature. Thus, the transfer efficiency of carriers is improved.

11 Claims, 3 Drawing Sheets

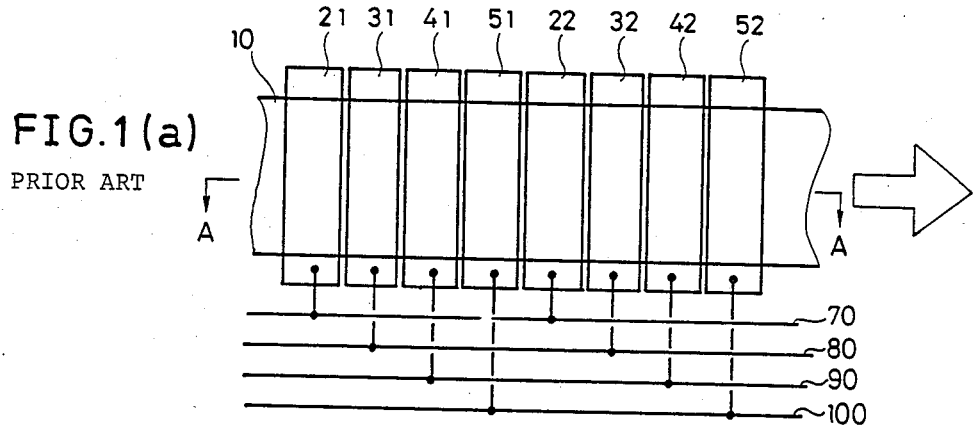
FIG.1(a) PRIOR ART
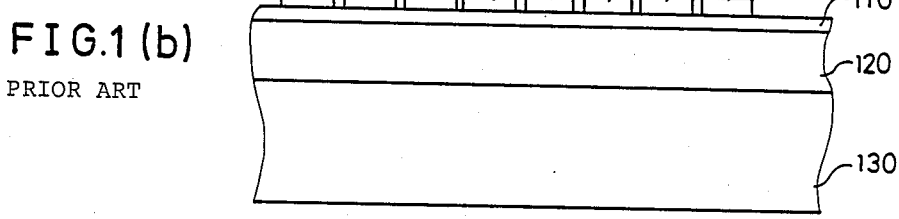
FIG.1(b) PRIOR ART
FIG.2 PRIOR ART
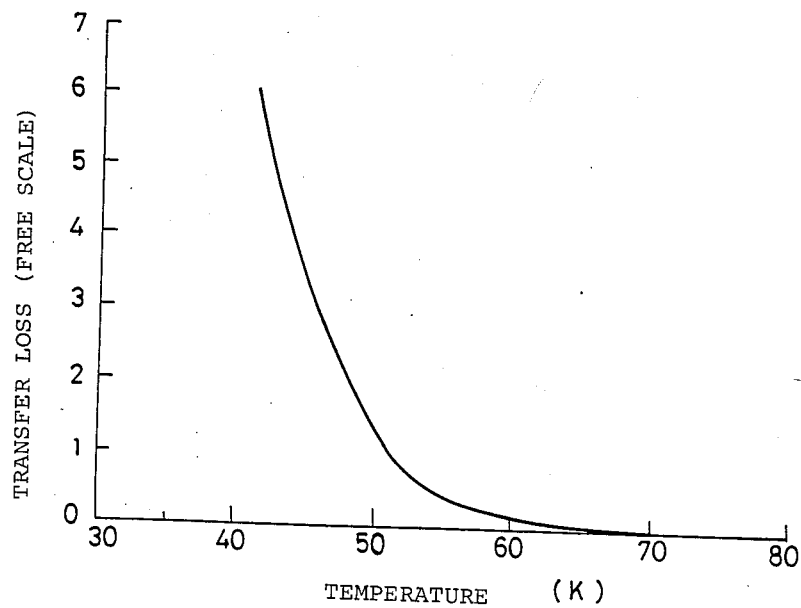

FIG. 3
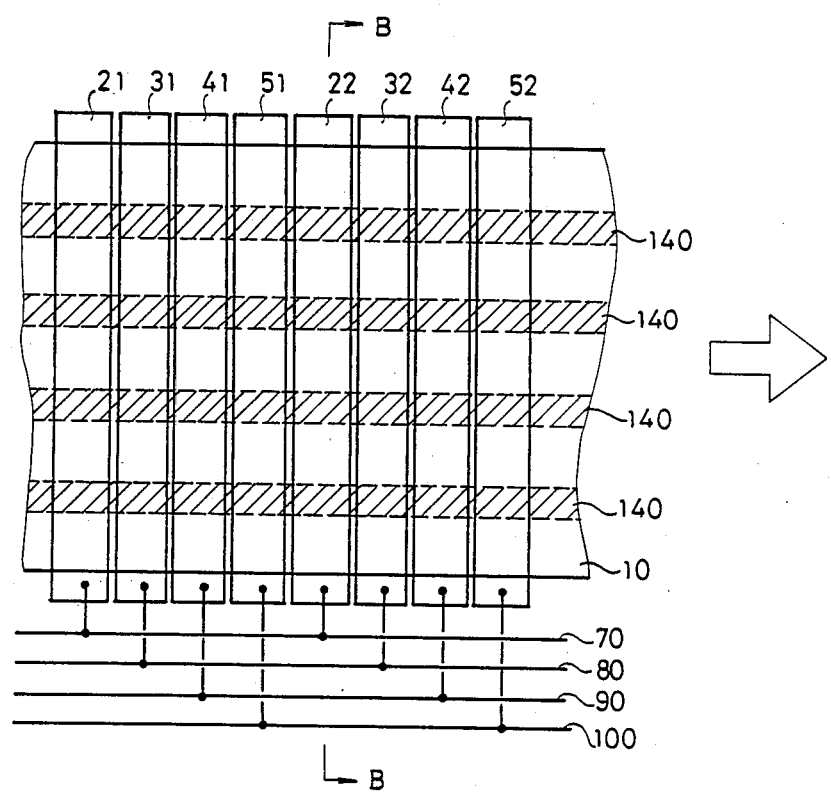
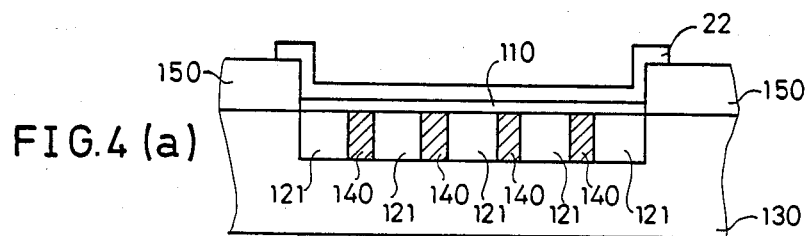
FIG. 4(a)
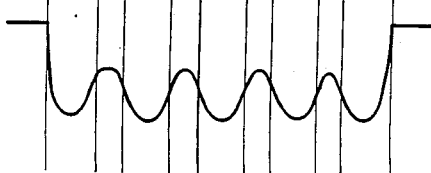
FIG. 4(b)

__4,809,048__

CHARGE-COUPLED DEVICE HAVING CHANNEL REGION WITH ALTERNATELY CHANGING POTENTIAL IN A DIRECTION PERPENDICULAR TO CHARGE TRANSFER

This application is a continuation of application Ser. No. 804,072, filed Dec. 3, 1985, now abandoned.

BACKGROUND OF THE INVENTION

1. Field of the Invention

The present invention relates to a charge-coupled device and particularly to a charge-coupled device having an improved transfer efficiency at a low temperature.

2. Description of the Prior Art

Recently, infrared image sensors comprising a combination of an infrared ray detector of a quantum type and a silicon charge-coupled device have been developed. Such infrared image sensors are normally used at a low temperature approximate to a liquid nitrogen temperature (77K) so as to decrease dark current of the infrared ray detector and to obtain a satisfactory signal-to-noise ratio. Consequently, charge-coupled devices (CCD's) forming such image sensors need to be operated also at a low temperature. Conventionally, as a CCD used for such an image sensor, a buried-channel CCD (BCCD) having excellent characteristics such as high-speed operation, high transfer efficiency and low noise is utilized. Such a BCCD is disclosed for example in Bell Syst. Tech. J. Vol. 51 (1970) pp. 1635-1640 by R. H. Waldem et al.

FIG. 1(a) is a plane view of a conventional n channel BCCD of four-phase drive system and FIG. 1(b) is a sectional view taken along the line A—A in FIG. 1(a). First, the structure of the charge-coupled device shown in FIGS. 1(a) and 1(b) will be described. In FIG. 1(b), an n type impurity region 120 is formed on a p type silicon substrate 130, the impurity concentration of this region 120 being normally about ten times as high as the impurity concentration of the p type silicon substrate 130. On the n type impurity region 120, a gate oxide film 110 is formed and on the gate oxide film 110, a plurality of gate electrodes 21, 31, 41, 51, 22, 32, 42 and 52 are formed at predetermined intervals. In addition, as shown in FIG. 1(a), a transfer channel region 10 for transferring a signal charge is defined normally by providing a thick silicon oxide film or a high-concentration p type impurity region (not shown) in the peripheral portions of the substrate. To the gate electrodes 21 and 22, a clock signal of the first phase is applied through a clock bus line 70; to the gate electrodes 31 and 32, a clock signal of the second phase is applied through a clock bus line 80; to the gate electrodes 41 and 42, a clock signal of the third phase is applied through a clock bus line 90; and to the gate electrodes 51 and 52, a clock signal of the fourth phase is applied through a clock bus line 100.

In the following, the operation of the charge-coupled device shown in FIGS. 1(a) and 1(b) will be described. In the n channel BCCD having the above described structure, a potential to electrons in the n type impurity region 120 under the respective gate electrodes changes dependent on the gate potential. As the gate potential increases, the potential to electrons in the n type impurity region 120 decreases to reach a minimum value. The phases of the clock signals of the first, second, third and fourth phases applied through the clock bus lines 70, 80, 90 and 100, respectively, deviate from one another by $\pi/4$ so that the clock signals of more than one phase are always at a high potential. If the phases of the clock signals deviate in the order of the first clock→the second clock→the third clock→the fourth clock, a signal charge is transferred in the direction shown by an arrow in FIG. 1(a).

In such a BCCD as described above, with a low temperature approximate to a liquid nitrogen temperature enabling the infrared image sensor to operate, the transfer loss increases rapidly according to the fall of the temperature as shown in Japanese Journal of Applied Physics vol. 22 No. 6 (1983), pp. 975-980. FIG. 2 is a graph showing a relation between the temperature and the transfer loss in a conventional BCCD, in which the vertical axis represents the transfer loss and the horizontal axis represents the temperature. Such increase of the transfer loss is caused by capture of carriers to an impurity level in the n type impurity region 120, that is, a freezing phenomenon of carriers. Thus, in a conventional BCCD, the transfer efficiency is deteriorated at a low temperature due to such a freezing phenomenon, which constitutes a serious obstacle to the increase of picture elements of an image sensor.

SUMMARY OF THE INVENTION

Briefly stated, the present invention is a charge-coupled device comprising: a semiconductor substrate of a first conductive type; a semiconductor region of a second conductive type opposite to the first conductive type, this semiconductor region of the second conductive type being formed on the semiconductor substrate of the first conductive type and having a channel region for charge transfer; a gate insulating film formed on the semiconductor region of the second conductive type; and a plurality of gate electrodes formed on the gate insulating film, the potential of the channel region being changed along the direction perpendicular to the charge transfer direction.

According to another aspect of the present invention, the impurity concentration of the channel region changes along the direction perpendicular to the charge transfer direction.

According to a further aspect of the present invention, the thickness of the gate insulating film changes along the direction perpendicular to the charge transfer direction.

Therefore, a primary object of the present invention is to provide a charge-coupled device having a satisfactory transfer efficiency at a low temperature.

A principal advantage of the present invention is that by changing the potential of the charge transfer channel region along the direction perpendicular to the charge transfer direction, an electric field in the channel region in this perpendicular direction is made strong and the emission time constant for emitting from the impurity level the carriers captured therein at a low level can be made small.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1(a) is a plane view of a conventional BCCD.

FIG. 1(b) is a cross sectional view taken along the line A—A in FIG. 1(a).

FIG. 2 is a graph showing a relation between the temperature and the transfer loss in a conventional BCCD.

FIG. 3 is a plane view of a BCCD of an embodiment of the present invention.

FIG. 4(a) is a cross sectional view taken along the line B—B in FIG. 3.

FIG. 4(b) shows a potential to electrons in the channel regions corresponding to the cross section in FIG. 4(a).

DESCRIPTION OF THE PREFERRED EMBODIMENTS

Figure 5:
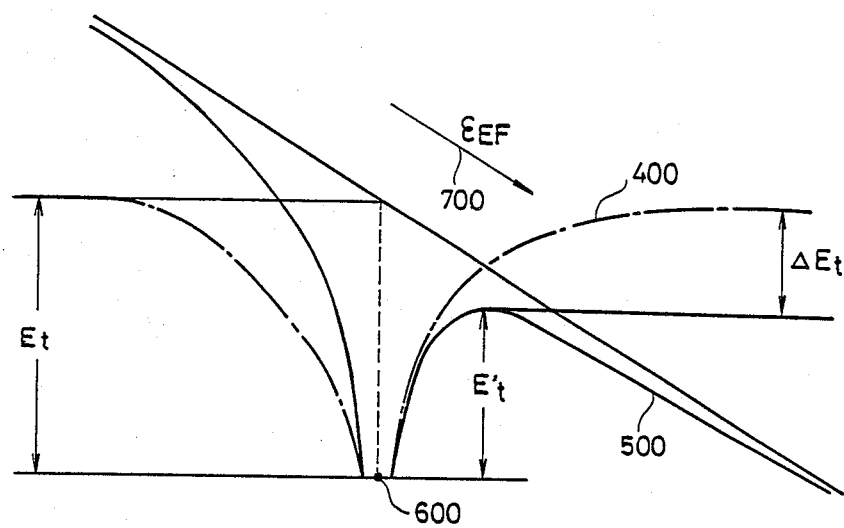
FIG. 5 is a potential showing a trap level in a BCCD of the present invention.

FIG. 3 is a plane view of a BCCD of an embodiment of the present invention and FIG. 4(a) is a cross sectional view taken along the line B—B in FIG. 3, namely, the direction perpendicular to the charge transfer direction (shown by an arrow in the figure). The embodiment shown in FIGS. 3 and 4(a) is the same as the conventional BCCD shown in FIGS. 1(a) and 1(b) except for the below described point. That is, a plurality of n type impurity regions 121 having a high impurity concentration and a plurality of n type impurity regions 140 having a low impurity concentration are formed alternately on a p type silicon substrate 130 along the direction perpendicular to the charge transfer direction. As shown in FIG. 3, the respective impurity regions 121 and 140 extend parallel to the charge transfer direction and have uniform widths. A charge transfer channel 10 is defined by a thick silicon oxide film 150 formed on the p type silicon substrate 130 as shown in FIG. 4(a).

Now, the operation of this embodiment of the invention shown in FIGS. 3 and 4(a) will be described. Referring to FIG. 4(a), since the n type impurity regions 121 of a high impurity concentration and the n type impurity regions 140 of a low impurity concentration are formed alternately in parallel, the potential to electrons in the channel becomes deep in the n type impurity regions 121 of a high impurity concentration and becomes shallow in the n type impurity regions 140 of a low impurity concentration as shown in FIG. 4(b). Thus, in the BCCD of this embodiment, the potential to electrons changes along the direction perpendicular to the charge transfer direction and as a result, the electric field in the channel region 10 in this perpendicular direction becomes strong.

As described above, deterioration of the transfer efficiency in the vicinity of a liquid nitrogen temperature where an infrared image sensor operates is caused by capture of carriers to the impurity level in the n type impurity regions, that is, a freezing phenomenon of carriers. However, such deterioration can be prevented by decreasing the emission time constant for emitting carries from the impurity level. More specifically, a charge emitted from the impurity level during the charge transfer process so as to be applied to a major signal does not deteriorate the transfer efficiency and accordingly, in order to improve the transfer efficiency, it is effective to shorten the time of emission of carriers from the impurity level, thereby to emit in a short time, as many carriers as possible captured at the impurity level and to apply these carriers to the major signal. The emission time constant τe from an energy level for capturing carriers, that is, a charge trap is generally represented by the following equation:

$$\tau e = [\rho \cdot V_{th} \cdot N_c \cdot \exp(-E_t/kT)]^{-1} \quad (1)$$

where $\rho$ is a capture cross section of the trap; $V_{th}$ is a mean thermal velocity; $N_c$ is an effective state density; $E_t$ is an energy level for the trap (measured from a conduction band); k is Boltzmann's constant; and T is a temperature.

As is clear from the equation (1), the emission time constant τe is a function strongly dependent on $E_t$. In order to shorten τe, it is effective to decrease $E_t$.

FIG. 5 is a diagram for explaining the effective lowering of $E_t$ in a strong electric field. In FIG. 5, if there is no electric field in the channel region, a potential barrier as indicated by 400 exists at the time of emission of the electrons captured at the impurity level, that is, the donar level 600. The trap level in this case becomes $E_t$ as shown in FIG. 5. If an external electric field $\epsilon_{EF}$700 exists in the channel region, the potential in this region becomes as shown by 500 and the barrier in the field direction is decreased by $\Delta E_t$ to attain $E_t'$. The decrease $\Delta E_t$ of the barrier is represented as follows:

$$\Delta E_t = \sqrt{(q\epsilon_{EF})/(\pi\epsilon_{Si})} \quad (2)$$

where q is a charge of an electron and $\epsilon_{Si}$ is a dielectric constant of the silicon.

As a result, in the BCCD of this embodiment of the invention shown in FIGS. 3 and 4(a), an electric field based on the change of the potential in the channel region is applied along the direction perpendicular to the charge transfer direction in addition to the electric field applied in the charge transfer direction as in a conventional BCCD. Thus, the trap level is lowered to decrease the carrier emission time constant, which serves to improve the transfer efficiency of the BCCD at a low temperature.

Figure 6A:
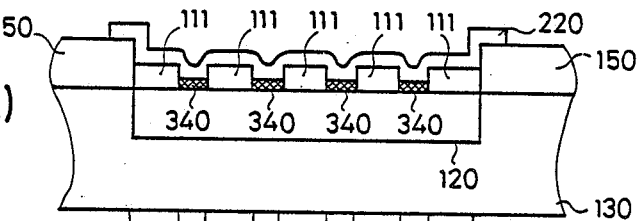
FIG. 6(a) is a cross sectional view of a BCCD of another embodiment of the present invention.
Figure 6B:
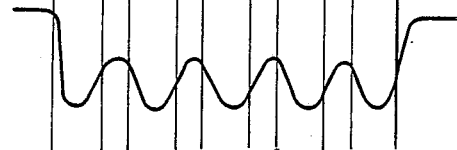
FIG. 6(b) shows a potential to electrons in the channel region corresponding to the cross section in FIG. 6(a).

FIG. 6(a) is a cross sectional view showing a BCCD of another embodiment of the present invention. The BCCD shown in FIG. 6(a) is the same as the BCCD shown in FIG. 4(a) except for the following point. That is, on an n type impurity region 120 having a uniform impurity concentration, thick gate oxide films 111 and thin gate oxide films 340 are formed alternately along the direction perpendicular to the charge transfer direction and over these gate oxide films 111 and 340, a gate electrode 220 is formed. Thus, the potential to electrons in the channel region becomes deep under the thick gate oxide films 111 and becomes shallow under the thin gate oxide films 340 as shown in FIG. 6(b). Accordingly, in the BCCD of this embodiment, the potential to electrons changes also along the direction perpendicular to the charge transfer direction and consequently, the electric field in this perpendicular direction in the channel region becomes strong and the emission time constant of the carriers from the impurity level becomes short, whereby the transmission efficiency of the BCCD at a low temperature is improved.

Although in the above described embodiments, a BCCD of the four-phase drive system was used, BCCD's of other drive system may be adopted to obtain the same effects as in the above described embodiments.

In addition, although in the above described embodiments, the n type impurity regions 121 of a high impurity concentration and the n type impurity regions 140 of a low impurity concentration causing a potential change in the channel region respectively extend parallel to the charge transfer direction and have uniform widths, the n type impurity regions may be of any suitable form and need not extend consecutively as far as a plurality of maximums and a plurality of minimums exist in the potential within an arbitrary cross section perpendicular to the charge transfer direction in the channel. Besides, if such maximums and minimums are respectively different values, the same effects as in the above described embodiments can be obtained.

Furthermore, although in the above described embodiments, a case of an n channel BCCD was taken as an example, completely the same structure can be manufactured also in a case of a p channel BCCD and in this case also, the same effects as in the above described embodiments can be achieved.

Furthermore, although in the above described embodiments, the impurity concentration of the transfer channel region or the thickness of the gate oxide films changes by steps along the direction perpendicular to the transfer direction, the impurity concentration or the film thickness may be changed continuously so that the same effects as in the above described embodiments can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A charge-coupled device having improved low temperature charge transfer efficiency, comprising:
   a semiconductor substrate (130) of a first conductivity type,
   a channel separation insulation layer (150) formed on said semiconductor substrate (130) and having an opening to define a channel region (10) in said substrate for transferring signal charge, said channel region being contiguous and of a second conductivity type opposite said first conductivity type and formed to have, in operation, a first potential that alternates repetitively between a high and a low value throughout said channel region perpendicular to a direction in which signal charge is transferred, said first potential alternating within a range that is deeper than a second potential in said semiconductor substrate below said channel separation layer (150) to reduce charge trapping in said channel region,
   a gate insulating film (110) formed on said channel region (10), and
   a plurality of gate electrodes (21, 31 . . . 52) formed at intervals on said gate insulating film (110) in the direction of signal charge transfer.

2. A charge-coupled device in accordance with claim 1, wherein:
   the impurity concentration of said channel region changes along a direction perpendicular to the direction in which a charge is transferred.

3. A charge-coupled device in accordance with claim 2, wherein:
   the impurity concentration of said channel region changes by steps as a result of forming a plurality of channel regions of a high impurity concentration (121) and a plurality of channel regions of a low impurity concentration formed alternately along the direction perpendicular to the direction in which a charge is transferred.

4. A charge-coupled device in accordance with claim 3, wherein:
   said plurality of channel regions of a high impurity concentration and said plurality of channel regions of a low impurity concentration respectively extend parallel to the direction in which a charge is transferred and respectively have uniform widths.

5. A charge-coupled device in accordance with claim 1, wherein:
   the thickness of said gate insulating film changes along the direction perpendicular to the direction in which a charge is transferred.

6. A charge-coupled device in accordance with claim 5, wherein:
   the thickness of said gate insulating film changes by steps as a result of forming a plurality of thick gate insulating films and a plurality of thin gate insulating films formed alternately along the direction perpendicular to the direction in which a charge is transferred.

7. A charge-coupled device in accordance with claim 6, wherein:
   said plurality of thick gate insulating films and said plurality of thin gate insulating films respectively extend parallel to the direction in which a charge is transferred and respectively have uniform widths.

8. A charge-coupled device in accordance with claim 1, wherein:
   said plurality of gate electrodes are driven by four phases.

9. A charge-coupled device in accordance with claim 1, wherein:
   the impurity concentration of said semiconductor region of the second conductive type is higher than the impurity concentration of said semiconductor substrate of the first conductive type.

10. A charge coupled device having improved low temperature charge transfer efficiency, comprising:
    a semiconductor substrate (130) of a first conductivity type;
    a channel separation insulation layer (150) formed on said semiconductor substrate and having an opening to define a channel region in said substrate for transferring signal charge, said channel region being contiguous and of a second conductivity type opposite said first conductivity type, wherein the impurity concentration of said channel region changes along a direction perpendicular to the direction of signal charge transfer so that the channel region has, in operation, a first potential that alternates repetitively between a high and a low value throughout said channel region perpendicular to said signal charge transfer direction, said first potential alternating within a range that is deeper than a second potential in said semiconductor substrate below said channel separation layer;
    a gate insulating film (110) formed on said channel region; and
    a plurality of gate electrodes (21), (31) . . . (52) formed at intervals on said gate insulating film in the direction of signal charge transfer.

11. A charge-coupled device having improved low temperature charge transfer efficiency, comprising:
    a semiconductor substrate (130) of a first conductivity type;

a channel separation insulation layer (150) formed on said semiconductor substrate and having an opening to define a channel region (10) in said substrate for transferring signal charge, said channel region being contiguous and of a second conductivity type opposite said first conductivity type and formed to have, in operation, a first potential that alternates repetitively between a high and a low value throughout said channel region perpendicular to the direction of signal charge transfer, said first potential alternating within a range that is deeper than a second potential in said semiconductor substrate below said channel separation layer;

a gate insulating film (110) having a thickness less than the thickness of said channel separation insulating layer formed on said channel region; and a plurality of gate electrodes (21), (31) ... (52) formed at intervals on said gate insulating film in the direction of signal charge transfer.

* * * * *